(12) United States Patent
Allison et al.

(10) Patent No.: US 9,042,197 B2
(45) Date of Patent: May 26, 2015

(54) POWER FAIL PROTECTION AND RECOVERY USING LOW POWER STATES IN A DATA STORAGE DEVICE/SYSTEM

(71) Applicant: Western Digital Technologies, Inc., Irvine, CA (US)

(72) Inventors: Michael S. Allison, Fort Collins, CO (US); Stephen J. Silva, Fort Collins, CO (US); Johnny A. Lam, Firestone, CO (US); Matthew Call, Longmont, CO (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/020,686

(22) Filed: Sep. 6, 2013

(65) Prior Publication Data

US 2015/0029808 A1 Jan. 29, 2015

Related U.S. Application Data

(60) Provisional application No. 61/857,503, filed on Jul. 23, 2013.

(51) Int. Cl.
*G11C 5/14* (2006.01)
*G11C 5/00* (2006.01)

(52) U.S. Cl.
CPC .............. *G11C 5/005* (2013.01); *G11C 5/148* (2013.01)

(58) Field of Classification Search
USPC ....................................................... 365/228
See application file for complete search history.

(56) References Cited

U.S. PATENT DOCUMENTS

| 5,414,861 | A | 5/1995 | Horning |
| 6,856,556 | B1 | 2/2005 | Hajeck |
| 7,003,620 | B2 * | 2/2006 | Avraham et al. ............... 711/103 |
| 7,126,857 | B2 | 10/2006 | Hajeck |
| 7,430,136 | B2 | 9/2008 | Merry, Jr. et al. |
| 7,447,807 | B1 | 11/2008 | Merry et al. |
| 7,502,256 | B2 | 3/2009 | Merry, Jr. et al. |
| 7,509,441 | B1 | 3/2009 | Merry et al. |
| 7,596,643 | B2 | 9/2009 | Merry, Jr. et al. |
| 7,653,778 | B2 | 1/2010 | Merry, Jr. et al. |
| 7,685,337 | B2 | 3/2010 | Merry, Jr. et al. |
| 7,685,338 | B2 | 3/2010 | Merry, Jr. et al. |
| 7,685,374 | B2 | 3/2010 | Diggs et al. |
| 7,688,661 | B2 * | 3/2010 | Fujioka et al. ................. 365/222 |
| 7,733,712 | B1 | 6/2010 | Walston et al. |
| 7,765,373 | B1 | 7/2010 | Merry et al. |
| 7,898,855 | B2 | 3/2011 | Merry, Jr. et al. |
| 7,912,991 | B1 | 3/2011 | Merry et al. |
| 7,936,603 | B2 | 5/2011 | Merry, Jr. et al. |
| 7,954,006 | B1 * | 5/2011 | Mangipudi ..................... 714/22 |
| 7,962,792 | B2 | 6/2011 | Diggs et al. |

(Continued)

OTHER PUBLICATIONS

International Search Report and Written Opinion dated Nov. 5, 2014 from related PCT Serial No. PCT/US2014/047706, 12 pages.

*Primary Examiner* — Son Mai

(57) ABSTRACT

Systems and methods for early warnings of power loss in solid state storage drives are disclosed. Early warnings of power loss can be used to power the drive to force the drive into a low power states before the energy in backup power sources, such as backup capacitors, is used. The low power states can allow for the reduction of power use by the drive which can provide cost savings and reduction in the risk that the drive will be rendered reconfigurable by a power failure event.

17 Claims, 2 Drawing Sheets

(56) References Cited

U.S. PATENT DOCUMENTS

| | | |
|---|---|---|
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,510,598 B2 * | 8/2013 | Vedder et al. ............... 714/22 |
| 8,521,972 B1 | 8/2013 | Boyle et al. |
| 8,549,236 B2 | 10/2013 | Diggs et al. |
| 8,566,639 B2 * | 10/2013 | Moshayedi et al. ........... 714/14 |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,627,117 B2 * | 1/2014 | Johnston ................ 713/300 |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2006/0069870 A1 | 3/2006 | Nicholson et al. |
| 2008/0215808 A1 * | 9/2008 | Ashmore et al. ............... 711/113 |
| 2009/0235038 A1 * | 9/2009 | Sartore ........................ 711/162 |
| 2010/0174849 A1 | 7/2010 | Walston et al. |
| 2010/0250793 A1 | 9/2010 | Syu |
| 2011/0099323 A1 | 4/2011 | Syu |
| 2011/0126046 A1 | 5/2011 | Hoang |
| 2011/0283049 A1 | 11/2011 | Kang et al. |
| 2012/0054520 A1 | 3/2012 | Ben-Tsion |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0111111 A1 | 5/2013 | Sartore |
| 2013/0132638 A1 | 5/2013 | Horn et al. |
| 2013/0145106 A1 | 6/2013 | Kan |
| 2013/0166864 A1 | 6/2013 | Yerushalmi et al. |
| 2013/0205065 A1 * | 8/2013 | Kloeppner et al. ........... 711/103 |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

* cited by examiner

POWER FAIL PROTECTION AND RECOVERY USING LOW POWER STATES IN A DATA STORAGE DEVICE/SYSTEM

CROSS-REFERENCE TO RELATED APPLICATIONS

This application claims priority to provisional U.S. Patent Application Ser. No. 61/857,503, filed on Jul. 23, 2013, which is hereby incorporated by reference in its entirety.

BACKGROUND

1. Technical Field

This disclosure relates to computing systems. More particularly, this disclosure relates to systems and methods for managing power in a data storage system.

2. Description of the Related Art

Data storage systems, such as solid-state storage systems, may include both volatile and non-volatile memory. When certain power loss events occur, data stored in volatile memory can be lost if such data is not transferred to non-volatile memory before available power is extinguished. Therefore, utilization of power resources can be an important function in data storage systems.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
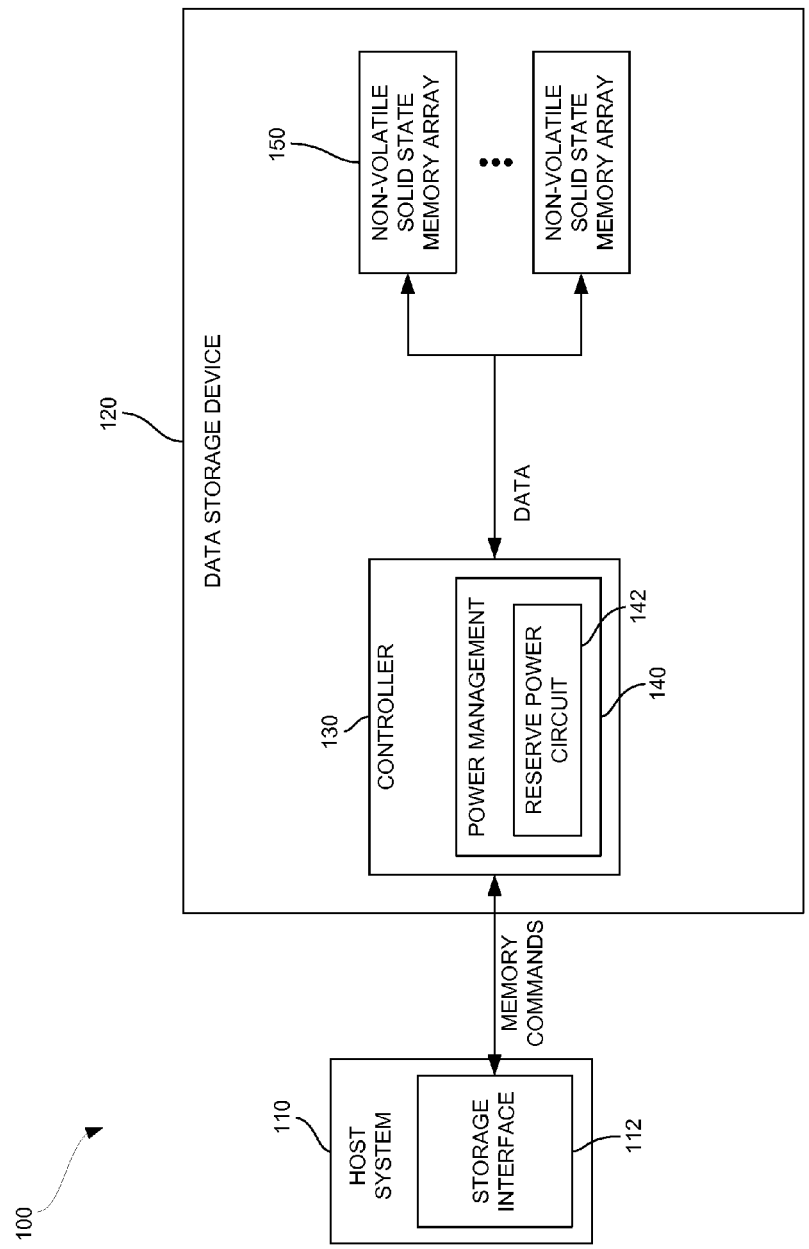
FIG. 1 is a block diagram illustrating an embodiment of a data storage system.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Overview

Data storage systems (e.g., solid-state data storage device) often maintain one or more system mapping tables that track relationships between host logical block addressing (LBA) and the physical location of the most current version of logical data in non-volatile solid-state storage (for example, NAND flash) of the data storage system. The system mapping table(s) may generally be maintained in fast-access volatile memory in order to improve drive performance. During normal operations, mapping data may be periodically written (i.e., "flushed") to non-volatile memory (NVM) so that the mapping table can be recreated after a power cycle. However, because mapping data may be written to NVM only periodically, or sporadically, during periods of time between updating the mapping data in volatile memory and saving the updates to NVM, mapping data stored in NVM may be incomplete. Therefore, if power loss occurs during such time, it may be desirable to write any intervening changes to the mapping data to NVM at the time of power loss, or in anticipation thereof, to prevent data loss.

In order to allow the storage system time to write changes in mapping data to NVM when power is removed, certain storage systems utilize one or more capacitors (or other charge-storing device(s)) to store enough energy to complete the writing of this information to NVM before the relevant power source is removed. However, depending on storage capacity, capacitors and other charge-storing devices can be relatively expensive, and can take up valuable space on a circuit die or printed circuit board (PCB). Furthermore, designing a system with enough storage capacitance to ensure that all necessary data saving operations can be executed successfully in connection with a power loss event, may present difficulties. Therefore, it may be desirable to implement power-saving mechanisms prior to the occurrence of power loss events in order to reduce the amount of power and/or time required by the system to save mapping data to NVM. Certain embodiments disclosed herein provide for the utilization of power warning signals and/or automatic transition to low-power states in order to reduce reliance on backup power. Such low power states may involve reducing power consumption and/or transferring of data to NVM.

Terminology

As used in this application, "non-volatile solid-state memory," "non-volatile memory," "NVM," or variations thereof may refer to solid-state memory such as NAND flash. However, the systems and methods of this disclosure may also be useful in more conventional hard drives and hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

Data Storage System

FIG. 1 is a block diagram illustrating an embodiment of a combination of a host system 110 with a data storage device 120 incorporating power management functionality for reducing power consumption in anticipation of system power loss. As shown, the data storage device 120 (e.g., hybrid hard drive, solid-state drive, any storage device utilizing solid-state memory, etc.) includes a controller 130, which in turn includes a power management module 140. In certain embodiments, the power management module 140 is configured to detect early signs of power loss in the data storage device 120. The controller 130 can further include internal memory (not shown) for caching system mapping data, which may be of one or more suitable memory types, such as, for example, DRAM. In some embodiments, the controller 130 is configured to perform the power-saving functions as further described below.

The controller 130 may be configured to receive memory access commands from a storage interface (e.g., a device driver) 112 residing on a host system 110. The controller 130 may further execute commands in response to such host-issued memory commands in the non-volatile solid-state memory arrays 150. Storage access commands communicated by the storage interface 112 can include write and read commands issued by the host system 110. The commands can specify a block address in the data storage device 120, and the controller 130 can execute the received commands in the non-volatile solid-state memory array(s) 150. Data may be accessed/transferred based on such commands.

The data storage device 120 can store data received from the host system 110 such that the data storage device 120 acts as data storage for the host system 110. To facilitate this function, the controller 130 can implement a logical interface. The logical interface can present to the host system memory as a set of logical addresses (e.g., sequential/contiguous addresses) where data can be stored. Internally, the controller 130 can map logical addresses to various physical memory addresses in the non-volatile solid-state memory array 150 and/or other memory module(s). Mapping data indicating the mapping of logical addresses to physical memory addresses may be maintained in the data storage device. For example, mapping table data may be stored in the non-volatile memory array(s) 150 in order to allow for recreation of mapping tables following a power cycle.

In certain embodiments, on power-up, the controller may cache mapping table data stored in the non-volatile solid-state memory array(s) 150 to volatile memory. In response to receipt and execution of host-issued memory commands, the controller 130 may update the cached mapping table data and periodically or sporadically flush such data to the memory array(s) 150. The cached mapping table data may be periodically flushed to the non-volatile memory array 150. For example, as data stored in volatile memory can be lost when power to the memory is removed, it may be necessary or desirable to flush any cached mapping data to non-volatile memory before power to the controller 130 is lost.

In an embodiment, the data storage device 120 may be a hybrid disk drive that additionally includes magnetic memory storage (not shown). In such case, one or more controllers 130 may control the magnetic memory storage and the non-volatile solid-state memory array(s) 150.

Power Loss Warning Signals

As described above, in certain embodiments, when power to the data storage device 120 is lost, reserve power stored in, for example, one or more electrical capacitors may be used to flush data stored in volatile memory to the non-volatile memory array(s). In order to reduce the burden on reserve power source(s), the power management module 140 may be configured to provide early warnings of power loss before power from reserve sources is used. The power management module 140 may cause the device to enter a reduced-power state, or progressive reduced-power states, based at least in part on detection of early signs of power loss. By causing the device to enter low power states, the power management module can provide reduced power use by the drive, which may lead to cost savings and/or reduced risk of data loss due to inadequate power supply resulting from power loss.

The power management module 140 includes a reserve power circuit 142. In certain embodiments, the reserve power circuit 142 is configured to provide power to the data storage device, or portions thereof, when power failure occurs. For example, the reserve power circuit 142 may comprise one or more charge-storing devices, wherein the one or more charge-storing devices collect charge during normal operation of the storage device 120. When power to the device is lost, or substantially reduced, the charge stored in the charge storing device(s) may be utilized to perform critical power-down tasks, such as flushing system data stored in volatile memory to the non-volatile storage 150. The reserve power circuit may comprise one or more capacitors, inductors, batteries, or the like.

In certain embodiments, the power management module 140 provides power loss warning signals when power has been reduced but has not yet dropped low enough to cause a switch to reserve power. Such warning signals may cause the drive to switch to lower power states, which in turn may reduce the power consumption and involve the flushing of data to NVM.

In the event that power is removed from the drive subsequently to the drive entering a reduced power state, then the amount of data required to be saved to NVM may have been reduced, thereby reducing the burden on the reserve power source(s). In the event that power is restored to the drive, then the power management module 140 may simply transition the drive from a lower power state to a higher, or full, power state.

Reduced Power States

Figure 2:
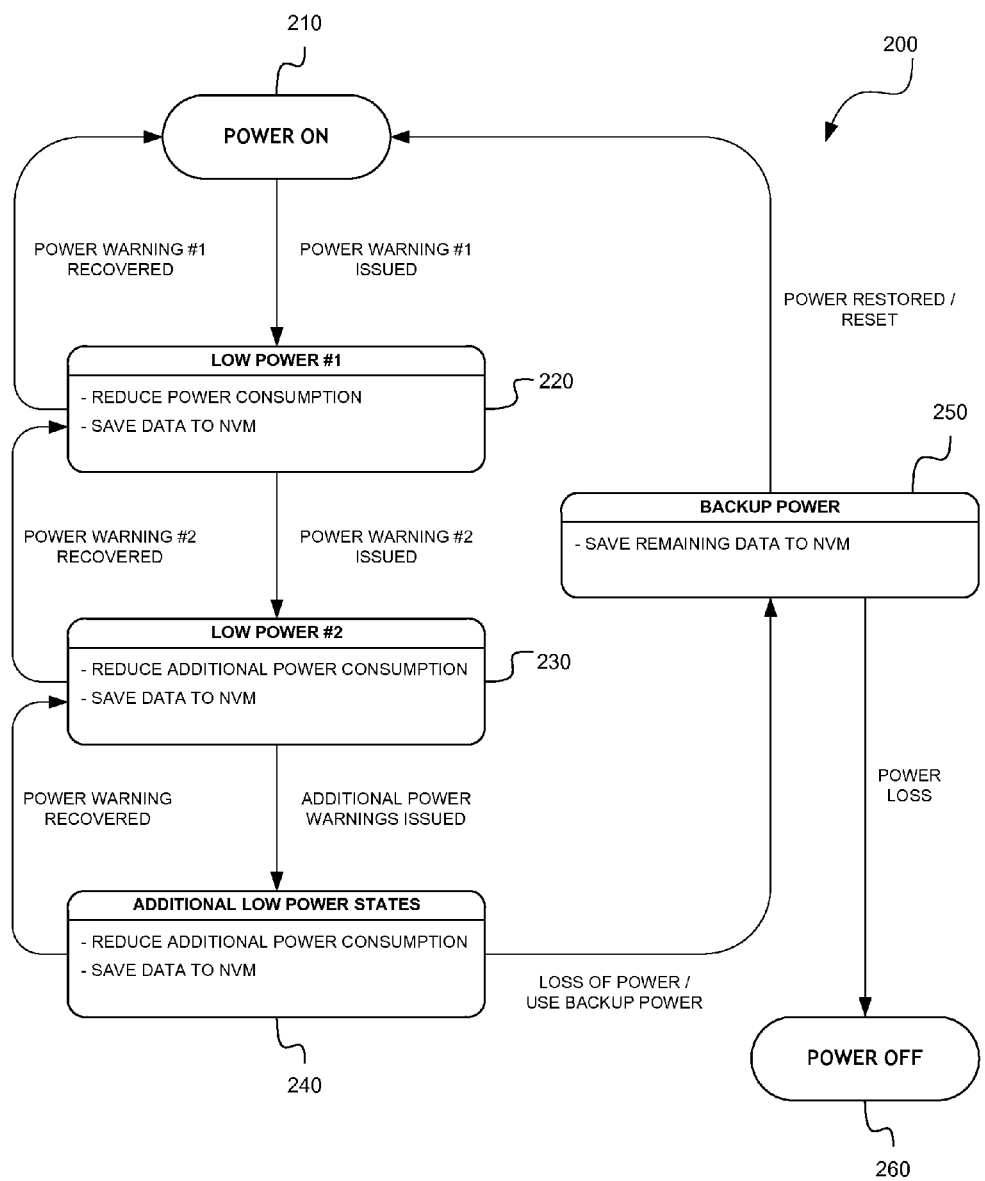
FIG. 2 is an illustration of a state diagram for a power management process in a data storage system according to one or more embodiments of the present disclosure.

FIG. 2 illustrates a state diagram for a process 200 for managing power in a data storage system. The process 200 shows the effects of power loss warning signals with respect to low power state transitions. For the sake of simplicity, the actions discussed below are described as being performed by the storage system/device. In some embodiments, the actions may be performed by a controller and/or a specific module/component, such as the power management module 140 described above. The process 200 includes a data storage system powering-on at block 210. Subsequent to the system entering a power-on state, the process 200 may include the issuance of a power warning ("power warning #1") in the system. In certain embodiments, a controller of the system receives such signal. For example, the controller may detect one or more signs/signals that a power loss event is impending. The power warning (or signal, sign, etc.) may take any relevant form. For example, in an embodiment, a power warning is represented, or initiated, by the reduction in power supply to the system, or to a component thereof. When supply power drops below a predetermined threshold, for example, the system may be configured to issue or detect a warning of impending power loss. In certain embodiments, the power warning comprises detection of a loss of link to one or more hosts. As shown in the diagram, the process 200 progresses to a low power state 220 ("low power #1") upon issuance or detection of the warning.

When in the first low power state 220, one or more actions may be taken to conserve power resources in view of the detected impending power loss event. For example, as shown, the system may be configured to reduce power consumption by one or more components of the system. By so doing, the system may slow down exhaustion of available power resources. For example, in an embodiment in which power warning #1 includes detection of a decline in power due at least in part to a loss or reduction of a power supply, wherein consumption by the system reduces the available power, reducing the amount of power consumed by the system may prolong the availability of power from the power supply. In certain embodiments, power may be cut or reduced to less important, or non-essential, processes and/or modules of the system. Instead, power resources may be reserved primarily or exclusively for more important, or critical, processes and/or modules.

An example of a process which may be prioritized in a low power state may include saving ("flushing") data stored in volatile memory to non-volatile memory to prevent loss of such data when power is substantially exhausted. As described above, data stored in volatile memory may include system mapping data. In certain embodiments, while in the low power state 220, the process 200 may include saving only a portion of data stored in volatile memory in non-volatile memory, wherein the portion is less than the remaining data to be stored in non-volatile memory. That is, actions taken in a reduced power state may be intended to place the system in a condition such that the amount of data to be saved to non-volatile memory is small enough to be performed relying primarily or exclusively on reserve power stored in a reserve power circuit. Therefore, it may be acceptable to allow some amount of data to remain in volatile memory while in the low power state 220.

While in a reduced power state, such as low power #1, the process 200 may involve receiving a power recovery signal, or detecting recovery of power. In certain embodiments, such an occurrence prompts the process 200 to return to a higher power state. For example, with respect to a first low power state 220, the process 200 may proceed to a full, or substantially full, power state upon power recovery. In certain embodiments, the power recovery detected while in a low power state may be related to the power warning that prompted entrance by the system into the low power state to begin with. For example, if the power warning comprises detection of a decrease of power from a power supply below a threshold, the corresponding recovery may be detected when power from the threshold once again elevates above the threshold, or a related threshold.

The diagram of FIG. 2 includes a second low power state, low power #2. In certain embodiments, the process 200 may proceed from low power #1 to low power #2 when a second power warning is received while the system is in low power state #1. The second power warning may be of a similar nature to the first power warning, or may be a different type of warning.

In certain embodiments, while in the second low power state 230, the process may involve receiving a second recovery signal, which, similarly to the power warning #1 recover, prompts reentry into a higher power state. The second power recovery may cause the process 200 to revert to the first low power state 220, or may bypass the first low power state to a higher power state, such as a full, or substantially full, power state. The second power recovery may have some or all of the features of the first power recovery described above. The second low power state 230 may involve the implementation of similar power-reducing steps to those associated with the first low power state 220. For example, further reduction of power consumption may be implemented and additional data stored in volatile memory may be flushed to non-volatile memory.

The process 200 may include a power hierarchy that includes one or more additional reduced power states, represented by the low power state(s) 240. The process 200 generally may step through the relevant power state hierarchy during power-down and/or power-up processes. For example, the process may not be configured to bypass states in progressing to or from the power on state 210 and/or power off state 260.

When power loss occurs, the process 200 may involve entering a backup power state 250 in which additional actions are performed in preparation of entering a power off state 260. For example, remaining data may be saved in non-volatile memory. In certain embodiments, power from a reserve power circuit, as described above, is at least partially relied on for executing any necessary or practical tasks in the backup power state 250. Loss of power may occur while the process 200 is in any of the relevant low power states. In certain embodiments, the process 200, upon detection of power loss, steps down through the remaining power management hierarchy before entering the backup power state 250. In another embodiment, the process 200 may be designed to direct the system directly from an intermediate state of the power management hierarchy to the backup power state 250 upon detection of power loss.

CONCLUSION

Systems and method disclosed herein may provide reduced storage device cost by reducing the number of capacitors (or other power-storing devices), or storage capacitance thereof, needed to write data from volatile to non-volatile in view of the reduced amount of data to be written. It can also reduce the risk of drive failure when degradation occurs to the capacitors that reduced the amount of energy stored.

Furthermore, in certain embodiments, a data storage device may use firmware for power management in the device. Such power management may be configured to handle device power states. The controller 130 described above may utilize preexisting device power management firmware in establishing the various low power states disclosed herein. Coupling the power loss warning to power state management may provide reduced firmware development cost.

Those skilled in the art will appreciate that in some embodiments, other types of data storage systems and/or power management can be implemented. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage device comprising:
 a non-volatile solid-state memory array comprising a plurality of non-volatile memory devices configured to store data;
 a volatile memory array configured to store data;
 a reserve power circuit comprising at least one energy storage device; and
 a controller having a power input configured to receive power from a primary power source for powering the data storage device during normal operation;
 wherein the controller is configured to:

detect that a loss of power from the primary power source is impending while receiving power from the primary power source; and in response to said detecting, cause the storage device to enter a first reduced power state, wherein power consumption of the device is reduced and a first portion of data stored in the volatile memory array is stored in the non-volatile solid-state memory array using power from the primary power source;

wherein the storage device does not use power from the reserve power circuit while in the reduced power state.

2. The data storage device of claim 1, wherein the controller is further configured to, while the storage device is in the first reduced power state:

detect a loss of power from a primary power source; and in response to detecting the loss of power from the primary power source, cause the storage device to enter a backup power state, wherein a second portion of data stored in the volatile memory array is stored in the non-volatile solid-state memory array using power from the reserve power circuit.

3. The data storage device of claim 2, wherein the second portion of data comprises a remaining portion of data stored in the volatile memory array.

4. The data storage device of claim 1, wherein the controller is further configured to, subsequently to the storage device entering the first reduced power state:

in response to detecting that a loss of power from the primary power source is impending, cause the storage device to enter a second reduced power state, wherein power consumption of the device is further reduced and a second portion of data stored in the volatile memory array is stored in the non-volatile solid-state memory array using power from the primary power source.

5. The data storage device of claim 1, wherein the controller is further configured to, while the storage device is in the first reduced power state:

receive a recovery signal indicating that the loss of power from the primary power source is no longer impending; and in response to receiving the recovery signal, cause the storage device to enter a higher power state.

6. The data storage device of claim 1, wherein detecting that the loss of power from the primary power source is impending comprises detecting that the power from the primary power source has dropped below a predetermined threshold.

7. A data storage device comprising:

a non-volatile solid-state memory array comprising a plurality of non-volatile memory devices configured to store data;

a volatile memory array configured to store data;

a reserve power circuit comprising at least one energy storage device; and a controller having a power input configured to receive primary power from an external source for powering the data storage device during normal operation;

wherein the controller is configured to:

detect a decrease in the primary power received on the power input; and prior to the data storage device entering a reserve power state, cause the data storage device to enter a reduced power state in response to detecting the decrease in power, wherein the data storage device saves at least a portion of data stored in the volatile memory array in the non-volatile solid-state memory array using the primary power from the external source and reduces power consumption when in the reduced power state.

8. The data storage device of claim 7, wherein the at least a portion of data comprises system mapping data.

9. The data storage device of claim 7, wherein the controller is further configured to:

detect, while the storage device is in the reduced power state, a loss of the primary power on the power input; and in response to the loss of the primary power, cause the data storage device to enter a backup power state.

10. In a data storage system comprising a non-volatile solid-state memory array and a controller, a method of managing power, the method comprising:

detecting that a loss of power from a primary power source is impending; and in response to said detecting, causing the data storage system to enter a first reduced power state by:

reducing an amount of power from the primary power source consumed by the data storage system; and storing a first portion of data stored in a volatile memory array in a non-volatile solid state memory array using power from the primary power source;

wherein power from a reserve power circuit is not used while the data storage system is in the first reduced power state.

11. The method of claim 10, further comprising, while the data storage system is in the first reduced power state:

detecting a loss of the power from the primary power source; and in response to detecting the loss of the power from the primary power source, causing the data storage system to enter a backup power state by storing a second portion of data stored in the volatile memory array in the non-volatile solid-state memory array using power from the reserve power circuit.

12. The method of claim 10, further comprising, subsequently to the data storage system entering the first reduced power state:

in response to detecting that a loss of power from the primary power source is impending, causing the data storage system to enter a second reduced power state by:

further reducing the amount of power from the primary power source consumed by the data storage system; and storing a second portion of data stored in the volatile memory array in the non-volatile solid-state memory array using power from the primary power source.

13. The method of claim 10, further comprising, while the data storage system is in the first reduced power state:

receiving a recovery signal indicating that power from the primary power source has been restored; and in response to receiving the recovery signal, causing the data storage system to enter a full power state.

14. In a data storage system comprising a non-volatile solid-state memory array and a controller, a method of managing power, the method comprising:

receiving power from a primary power source on a power input port;

detecting a decrease in power from the primary power source received on the power input port; and prior to the data storage system entering a reserve power state, causing the data storage system to enter a reduced power state in response to detecting the decrease in power from the primary power source by:

saving at least a portion of data stored in a volatile memory array of the data storage system in a non-volatile solid-state memory array of the data storage system using power from the primary power source; and reducing power consumption of the data storage system.

15. The method of claim 14, wherein the at least a portion of data comprises system mapping data.

16. The method of claim 14, further comprising:

detecting, while the data storage system is in the reduced power state, a loss of power from the primary power source on the power input port; and in response to the loss of power from the primary power source, causing the data storage system to enter a backup power state.

17. The method of claim 14, wherein said detecting comprises detecting that power from the primary power source received on the power input port has dropped below a predetermined threshold.

* * * * *